US009425797B2

(12) United States Patent
Ali

(10) Patent No.: US 9,425,797 B2
(45) Date of Patent: Aug. 23, 2016

(54) HIGH PERFORMANCE RECONFIGURABLE VOLTAGE BUFFERS

(71) Applicant: ANALOG DEVICES, INC., Norwood, MA (US)

(72) Inventor: Ahmed Mohamed Abdelatty Ali, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/307,467

(22) Filed: Jun. 17, 2014

(65) Prior Publication Data

US 2015/0311895 A1   Oct. 29, 2015

Related U.S. Application Data

(60) Provisional application No. 61/984,557, filed on Apr. 25, 2014.

(51) Int. Cl.

| | | |
|---|---|---|
| *H03K 19/017* | (2006.01) | |
| *H03K 19/0175* | (2006.01) | |
| *H03F 1/32* | (2006.01) | |
| *H03F 3/50* | (2006.01) | |
| *H03F 3/195* | (2006.01) | |
| *H03F 3/45* | (2006.01) | |
| *H03F 3/72* | (2006.01) | |
| *H03F 3/193* | (2006.01) | |

(52) U.S. Cl.
CPC .... *H03K 19/017509* (2013.01); *H03F 1/3205* (2013.01); *H03F 3/193* (2013.01); *H03F 3/195* (2013.01); *H03F 3/45183* (2013.01); *H03F 3/505* (2013.01); *H03F 3/72* (2013.01); *H03F 2200/261* (2013.01); *H03F 2203/45726* (2013.01); *H03F 2203/45728* (2013.01); *H03F 2203/7203* (2013.01)

(58) Field of Classification Search
CPC .... H03K 3/00; H03K 19/00; H03K 19/0013; H03K 5/003; H03K 5/08; G09G 3/28; G09G 3/296; G09G 3/2965; G09G 3/20
USPC ................................ 327/108, 109, 111, 333
See application file for complete search history.

(56) References Cited

U.S. PATENT DOCUMENTS

| | | |
|---|---|---|
| 6,778,013 B1 | 8/2004 | Ali |
| 7,119,584 B1 | 10/2006 | Ali |
| 7,378,883 B1 | 5/2008 | Hsueh |

(Continued)

FOREIGN PATENT DOCUMENTS

| | | |
|---|---|---|
| EP | 2937994 | 10/2015 |
| JP | 2013/150229 | 8/2013 |

OTHER PUBLICATIONS

European Search Report issued in EP Patent Application Serial No. 15163426.8 mailed Sep. 4, 2015, 10 pages.

(Continued)

*Primary Examiner* — John Poos
(74) *Attorney, Agent, or Firm* — Patent Capital Group

(57) ABSTRACT

In this disclosure, new structures for high-performance voltage buffers (source followers and emitter followers) are described. The structures achieve high performance (linearity) and reduce power consumption. In addition, they are reconfigurable to optimize the performance and power consumption depending on the input frequency range.

21 Claims, 13 Drawing Sheets

(56) References Cited

U.S. PATENT DOCUMENTS

| | | |
|---|---|---|
| 8,339,161 B2 | 12/2012 | Ali |
| 2002/0032893 A1 | 3/2002 | Brooks et al. |
| 2003/0030617 A1* | 2/2003 | Han .................. G09G 3/3688 345/98 |
| 2009/0315594 A1* | 12/2009 | Pentakota ............ H03F 3/505 327/109 |
| 2011/0006815 A1 | 1/2011 | Ali |
| 2013/0141140 A1* | 6/2013 | Kumar ........................ 327/108 |

OTHER PUBLICATIONS

J. Ramírez-Angulo et al., "Low-Power Low-Voltage Analog Electronic Circuits Using the Flipped Voltage Follower", 0/7803-7369-3/02 © 2002 IEEE, pp. 1327-1330 [4 pages].

* cited by examiner

HIGH PERFORMANCE RECONFIGURABLE VOLTAGE BUFFERS

CROSS-REFERENCE TO RELATED APPLICATION

This non-provisional patent application receives benefit from or claims priority to, under 35 U.S.C. §119(e), U.S. Provisional Patent Application Ser. No. 61/984,557, filed Apr. 25, 2014 and entitled "HIGH PERFORMANCE RECONFIGURABLE VOLTAGE BUFFERS", which is hereby incorporated by reference in its entirety.

TECHNICAL FIELD OF THE DISCLOSURE

The present disclosure relates generally to electronic circuits and, more particularly, to the high performance voltage buffers.

BACKGROUND

Electronics often include components which convert analog signals to digital signals. Once the analog signals are converted into digital signals, computer processors can process the digital signals efficiently to provide a variety of valuable functions. These components are referred to generally as converters, and more specifically, analog-to-digital converters (ADCs) or samplers. ADCs are used in a myriad of applications, such as telecommunications, automotive technology, medical devices, audio technology, video technology, etc. Depending on the application, different types of ADCs are used. The designs for the ADCs can vary drastically, and the need to improve these ADCs continue to rise as the requirements for these ADCs rises.

SUMMARY OF THE DISCLOSURE

In this disclosure, new structures for high-performance voltage buffers (source followers and emitter followers) are described. The structures achieve high performance (linearity) and reduce power consumption. In addition, they are reconfigurable to optimize the performance and power consumption depending on the input frequency range.

DESCRIPTION OF EXAMPLE EMBODIMENTS OF THE DISCLOSURE

Understanding Voltage Buffers

Voltage buffers (such as emitter followers or source followers) are commonly used as an isolation buffer between upstream and downstream circuits. For example, voltage buffers may be used in sampler circuits to maintain good linearity of the output signal by isolating the input from the switching effects of the sampling switches. In theory, an ideal voltage buffer has characteristics of an infinite input impedance and zero output impedance over an infinite bandwidth to drive the downstream circuit. Thus, the voltage buffer may supply a load device a load current while keeping the output voltage fixed because of the very low output impedance. However, in practice, voltage buffers do not always have these ideal characteristics.

Voltage buffers are frequently used in samplers to achieve good linearity at high input frequency. They also help isolate the input from the switching effects of the sampling switches. One of the challenges of the input voltage buffer designs is that an optimum design for a certain frequency range (for example: for IF sampling at 200-300 MHz) may not be optimum for another frequency range (such as for RF sampling at 1-2 GHz). While one design can achieve near ideal characteristics for one frequency range, that design can perform poorly for another frequency range.

Within the context of this disclosure, the relative terms "low frequency" and "high frequency" can refer to actual quantitative frequency ranges. "Low frequency" refers to input frequencies up to roughly 500 MHz (e.g., 100-500 MHz). "High frequency" refers to input frequencies around 500 MHz to 2 GHz.

Figure 1:
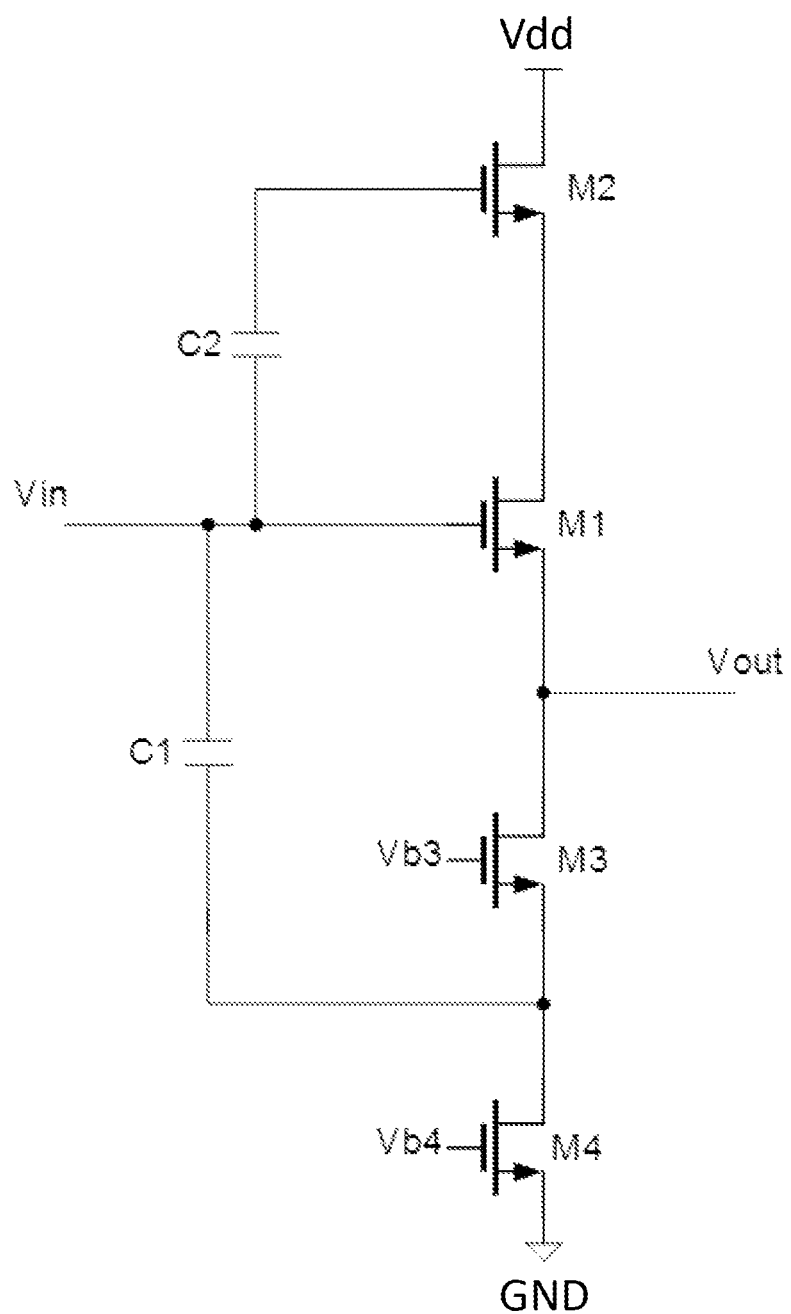
FIG. 1 is a schematic circuit diagram of an exemplary voltage buffer which compromises for various input frequency ranges, according to some embodiments of the disclosure.

One Exemplary Implementation: Compromising to Cover a Wide Input Frequency Range FIG. 1 is a schematic circuit diagram of an exemplary voltage buffer which compromises for various input frequency ranges, according to some embodiments of the disclosure. The circuit design shown in this FIGURE shows a source follower, and the design represents a trade-off that covers a wide input frequency range. Furthermore, this design can achieve reasonable power consumption. While FIG. 1 shows a source follower, a person with ordinary skill in the art would appreciate that the same topology can be used to implement an equivalent emitter follower using one or more bipolar junction transistors (BJTs).

This design has four transistor devices, M2, M1, M3, and M4 connected in series (e.g., stacked in this particular order), where the drain of M2 is connected to Vdd and the source of M4 is connected to ground. In this example, the four transistor devices are n-type metal-oxide semiconductor transistor (NMOS) devices. Specifically, the source of M2 is connected to the drain of M1, the source of M1 is connected to the drain of M3, and the source of M3 is connected to the drain of M4. Vin is provided to the gate of M1 (i.e., the gate of M1 is connected to the voltage input node), and Vout is taken at the source of M1 (drain of M3) (i.e., the source of M1 is connected to the voltage output node).

A voltage buffer has a voltage input node and a voltage output node. The voltage buffer can include a source follower device having a first terminal connected to the voltage input node and a second terminal connected to the voltage output node. In some embodiments, the source follower device comprises a first transistor device, the first terminal is the gate of the first transistor device, and the second terminal is the source of the first transistor device.

Furthermore, the voltage buffer can include a cascode current source device connected to the second terminal of the source follower device. The cascode current source device can include a second transistor device and a third transistor device (in a cascode configuration), and the source of the second transistor device can be connected to the drain of the third transistor device.

In the illustration of FIG. 1, the device M1 is the source follower device. In this configuration, the gate of M1 connected to the voltage input node Vin, and the source of M1 is connected to the voltage output node Vout. A source follower device typically has a transistor device whose gate is connected to the voltage input Vin, and whose source serves as the output. The source follower device can assist in transforming impedances, such as to provide a large input impedance and small output impedance. Broadly speaking, the source follower can buffer and isolate the input from the output, and in some cases, provide a higher input impedance. The devices M3 and M4 form a cascode current source device, where the source of M3 is connected to the drain of M4. A cascode current source device can deliver the current needed for device M1. Broadly speaking, the cascode current source may provide the necessary bias current with a relatively high output impedance.

Vout typically drives a load (not shown). The capacitance C1 (connected between the voltage input node Vin and the source of M3/the drain of M4) is provided for feedforward distortion cancellation. The use of C1 supplies replica current in a path from the voltage input node Vin to the source of M3, upwards through M3, and out via the drain of M3 towards Vout and towards the load. In this way, the current is supplied via this path (from Vin to the source of M3) instead of being provided by the source follower M1. As a result, the current variation of the source follower M1 is minimized and distortion at Vout is improved.

Besides having a source follower device and a cascode current source device, the voltage buffer can further include a bootstrap device. The bootstrap device can be implemented in different ways, and FIG. 1 shows one exemplary implementation (other exemplary implementations are described in relation to FIGS. 9-11). In this implementation, the bootstrap device is connected between the voltage input node and a third terminal of the source follower device (i.e., the drain of M1). Specifically, the bootstrap device is configured to reduce and control the variation of the voltage across the third terminal and the second terminal of the source follower device. The control of the variation of the voltage across the source follower device (i.e., the voltage at the output node as well) can be achieved in different ways, and FIG. 1 merely shows one way of providing it.

Broadly speaking, the bootstrap device can include a fourth transistor device having a source connected to the third terminal of the source follower device and a gate connection that helps to bootstrap the source follower device to output a voltage close to a voltage at the voltage input node or to the voltage output node, thereby reducing/controlling the variation of the voltage across the third terminal and the second terminal of the source follower device. In some cases, the gate is connected (directly or indirectly) to the voltage input node or to the voltage output node. The connection between the gate of the fourth transistor device to the voltage input node or the voltage output node can include a level shifter, or leaves out the level shifter in the connection. In any of these cases, the source of the fourth transistor device is connected to the third terminal of the first transistor device (e.g., the drain of M1).

In the example shown in FIG. 1, the gate of the fourth transistor device (M2) is connected to the input node via a first capacitor (e.g., capacitor C2) as the level shifter, i.e., one terminal of the first capacitor C2 is connected to the voltage input node Vin and the other terminal of the first capacitor C2 is connected to the gate of M2). The bootstrap device connects the gate of M2 to the voltage input node via C2. C2 is provided as a level shifting device to ensure the bias voltage of M1 is correct (other types of level shifting device for shifting the voltage appropriately are also envisioned, or the level shifting device can be left out). During operation, the source of M2 tends to follow the input voltage Vin. The source of M1 also tends to follow the input voltage Vin. Accordingly, the device M2 (and the capacitance C2) is a bootstrap device that reduces and controls the variation in the drain-to-source voltage Vds of the M1 device by forcing the drain of M1 to follow the voltage input Vin and hence the source of M1 as well. As a result, Vds is fixed and the linearity of M1 is improved.

The limitation of this structure is that the output impedance of the current source may not be large enough in fine geometry processes (such as 65 nm and 28 nm). This limits the linearity of the buffer especially at frequencies below 500 MHz.

Figure 2:
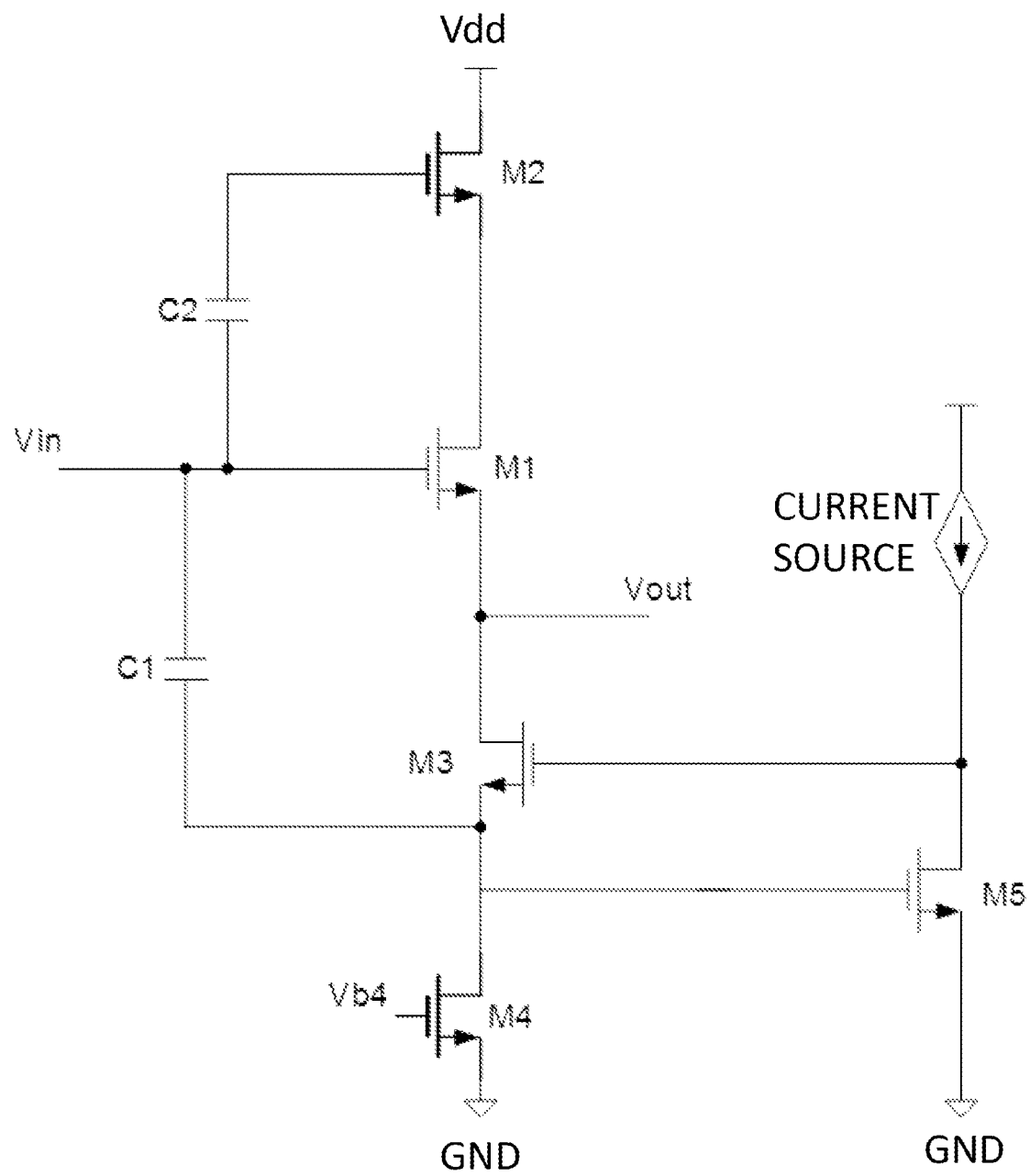
FIG. 2 is a schematic circuit diagram of an exemplary voltage buffer which is optimized for relatively low input frequencies up to 500 MHz, according to some embodiments of the disclosure.

One Exemplary Implementation: Adding an Active Cascode Device to Cover a Wide Input Frequency Range Another structure can be used to improve the linearity of the buffer below 500 MHz. FIG. 2 is a schematic circuit diagram of an exemplary voltage buffer which is optimized for relatively low input frequencies up to 500 MHz, according to some embodiments of the disclosure. In this circuit, an active cascode is used to increase the output impedance of the current source. This can improve the distortion by about 6-10 dB at 200 MHz and 300 MHz input frequencies.

Figure 12:
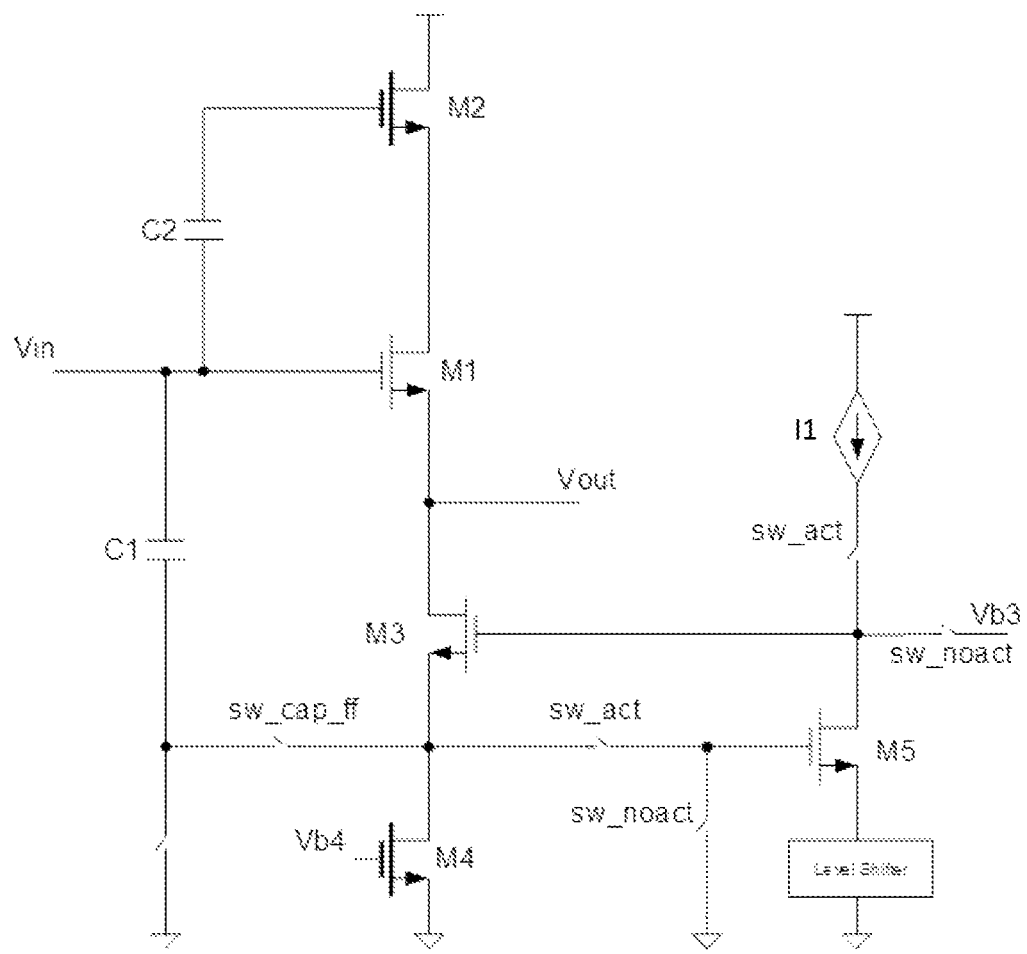
FIG. 12 shows an exemplary implementation for an active cascode device, according to some embodiments of the disclosure.
Figure 13:
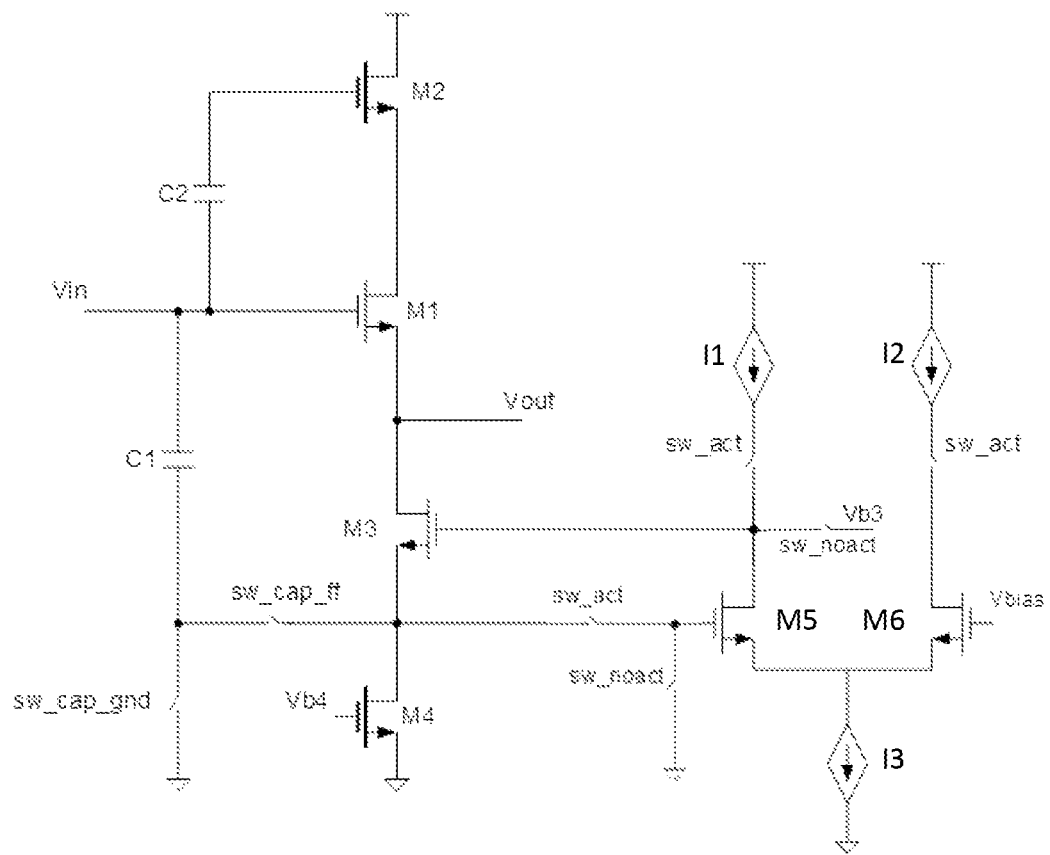
FIG. 13 shows another exemplary implementation for an active cascode device, according to some embodiments of the disclosure.

The circuit shown in FIG. 2 is similar to the circuit shown in FIG. 1, with several differences. M3, rather than being part of a cascode current source device, M3 becomes an active cascode device. The active cascode device can have different implementations, and in the example shown in FIG. 2, the active cascode device is formed using M3 and another transistor device M5. Other implementations of the active cascode device are shown in FIGS. 12 and 13. In the example shown in FIG. 2, the active cascode device is provided by adding another transistor device M5 (and a current source I1). M5 can be an NMOS device. The source of M5 is connected to ground, the gate of M5 is connected to the source of M3, and the drain of M5 is connected to the gate of M3. The output of the current source is connected to the gate of M3 and the drain of M5. The biasing of M5 is provided such that the voltage at the gate of M5 is an amplified version of the voltage at the source of M3. The effective gain of M3 is increased from $g_m r_o$ of M3 to $g_m r_o$ of M3 multiplied by $g_m r_o$ of M5. The output impedance of the current source is approximately equal to $r_o$ of M4×$g_m r_o$ of M3. If the effective gain of M3 is increased, the output impedance also increase. The increased gain of M3 increases output impedance and improves linearity of the voltage buffer.

This active cascode structure however tends to have speed limitations that limits its usefulness and/or efficiency at very high input frequencies. Specifically, the loop of the active cascode having M3 and M5 has to settle (and takes time to do so) and the impedance is not as high as it needs to be. For these reasons, the loop can cause issues when the voltage input frequency is too high. The same limitation applies to the feedforward distortion cancellation cap C1.

One Exemplary Implementation: Bypass Capacitance for High Frequencies

Figure 3:
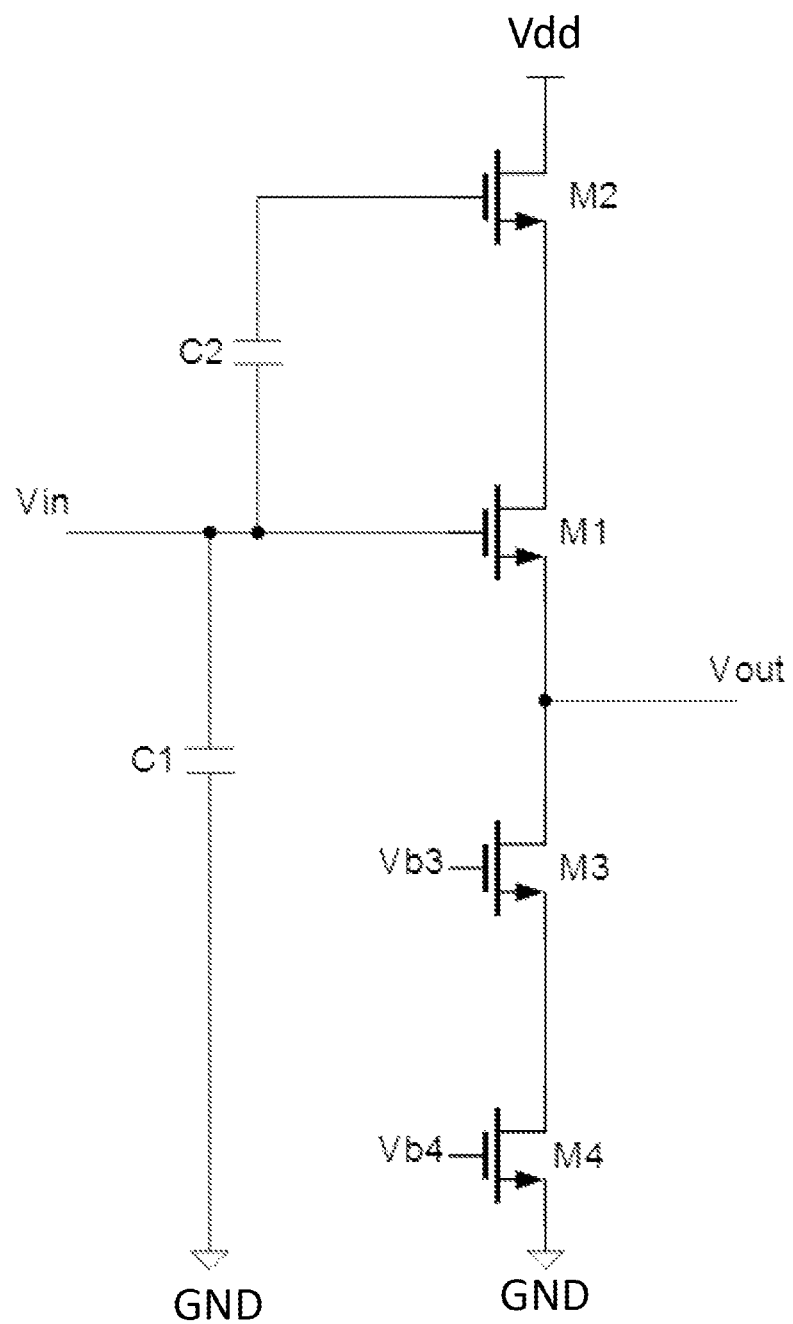
FIG. 3 is a schematic circuit diagram of an exemplary voltage buffer which is optimized for high input frequencies above 500 MHz, according to some embodiments of the disclosure.

For frequencies in the range of 1-2 GHz, a different circuit design may be needed. FIG. 3 is a schematic circuit diagram of an exemplary voltage buffer which is optimized for high input frequencies above 500 MHz, according to some embodiments of the disclosure. If the active cascode is removed (the device M5 and the current source from the diagram shown in FIG. 2), and the feedforward C1 distortion cancellation loop is removed (C1 is connected between Vin and ground in FIG. 3 instead), the circuit performs well at high frequencies. In this example, C1 now provides bypass capacitance. Bypass capacitance C1 helps reduce the effect of the kickback from the load reaching the voltage input.

One Exemplary Implementation: Removing Bypass Capacitance for Wider Bandwidth

Figure 4:
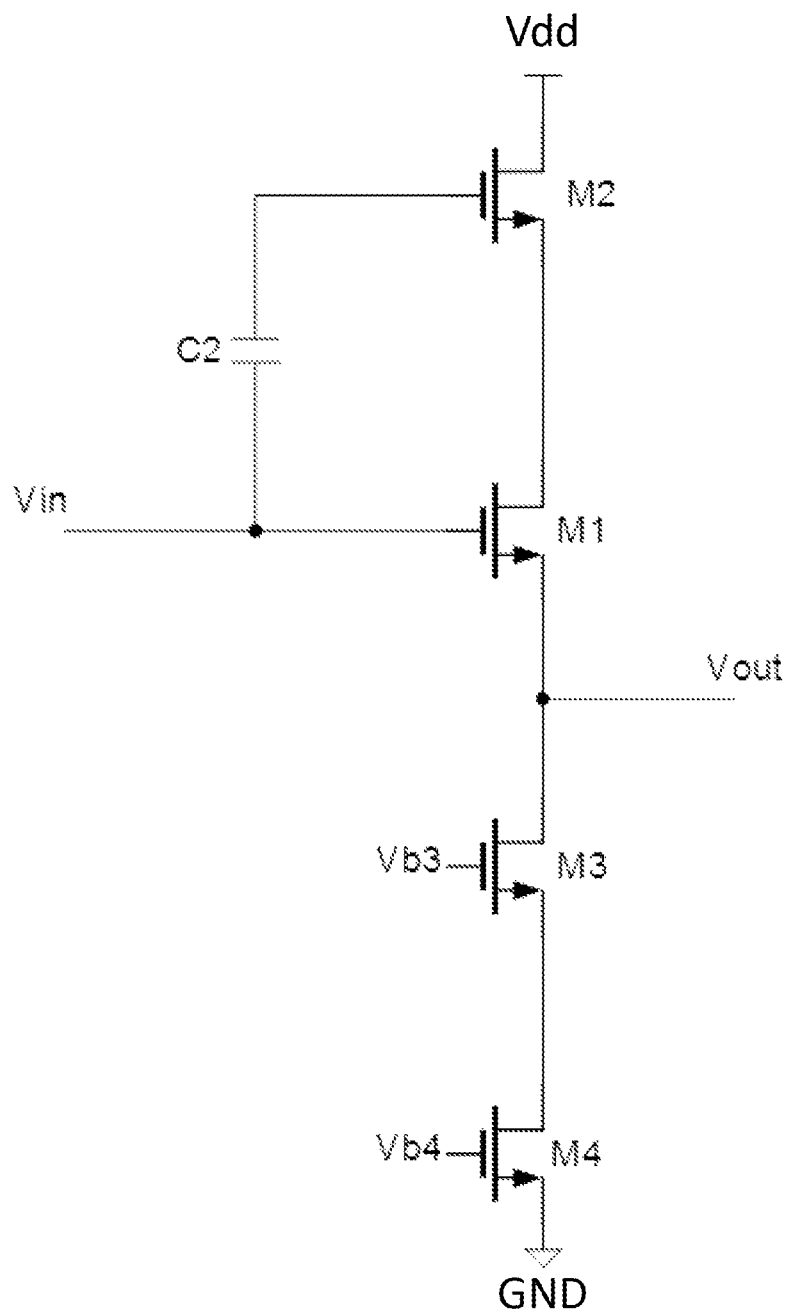
FIG. 4 is a schematic circuit diagram of an exemplary voltage buffer which is optimized for high input frequencies above 500 MHz and for maximum input bandwidth, according to some embodiments of the disclosure.

FIG. 4 is a schematic circuit diagram of an exemplary voltage buffer which is optimized for high input frequencies above 500 MHz and for maximum input bandwidth, according to some embodiments of the disclosure. Bypass capacitance C1, while helps with distortion, can significantly limit the bandwidth of the voltage buffer. If a wider input bandwidth is preferred over a superior distortion, or a user wishes to use the buffer at lower sample rates where the benefit of the bypass cap C1 in FIG. 3 is not needed, the bypass capacitance C1 can be completely removed, as shown in FIG. 4.

One Exemplary Implementation: A Reconfigurable Buffer

Figure 5:
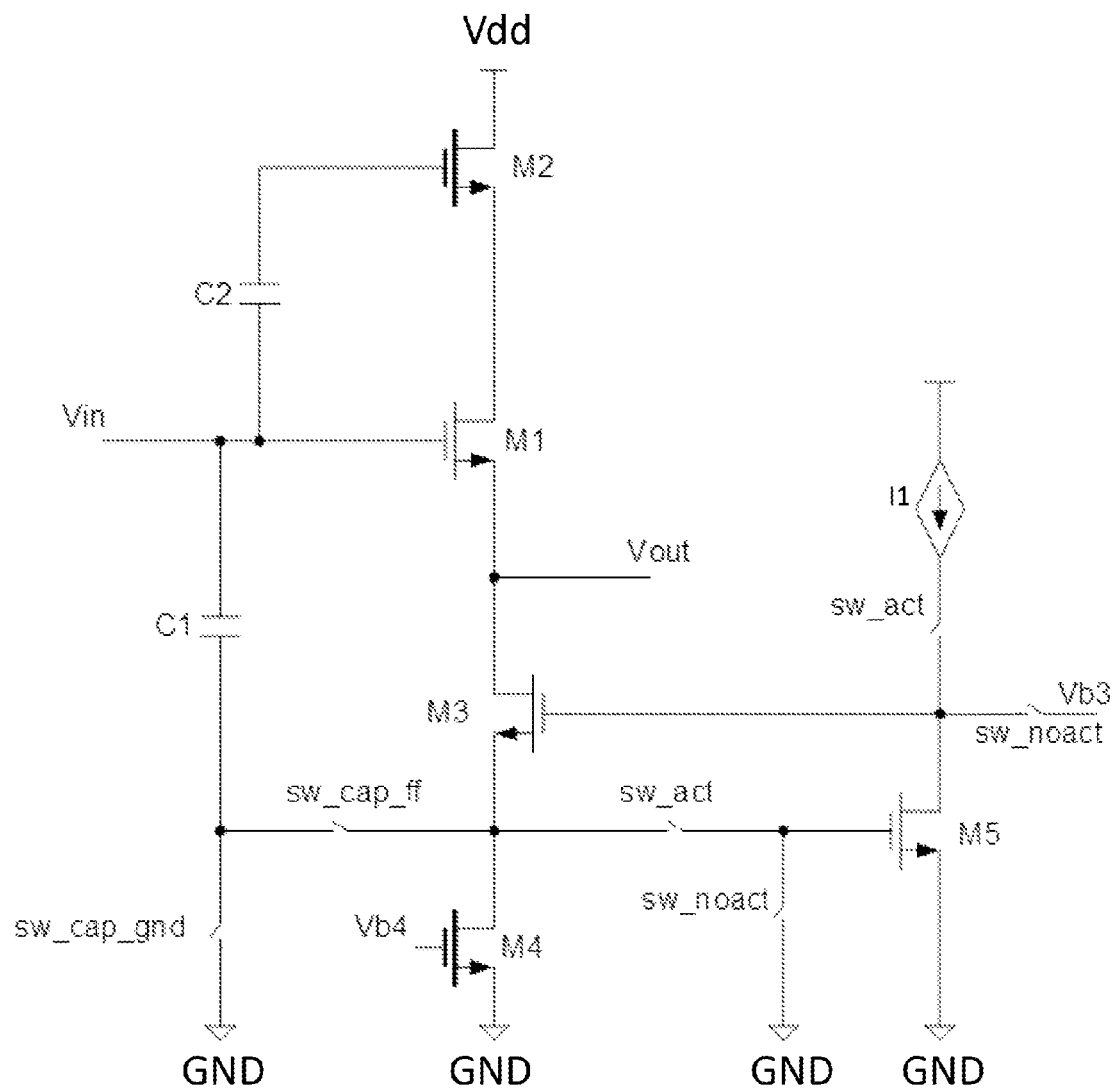
FIG. 5 is a schematic circuit diagram of an exemplary voltage buffer which is configurable to realize the structures shown in FIGS. 1-4, according to some embodiments of the disclosure.

Leveraging all the advantages of the above described exemplary implementations, a comprehensive design can be provided with strategic placement of switches can combine all the designs into one flexible and configurable design. In this manner, a reconfigurable buffer is presented that can be optimized for low frequency, high frequency and input bandwidth. FIG. 5 is a schematic circuit diagram of an exemplary voltage buffer which is configurable to realize the structures shown in FIGS. 1-4, according to some embodiments of the disclosure.

A set of switches, sw_cap_ff, sw_cap_gnd, sw_act (2 switches), and sw_noact (2 switches) can be provided to configure the reconfigurable buffer. The sw_cap_ff switch connects one of the terminals of C1 (not the terminal of C1 which connects C1 to Vin) to the source of M3 if the switch is on. The sw_cap_ff switch is turned on if C1 feedforward cancellation is desired. The sw_cap_gnd switch connects one of the terminals of C1 (not the terminal of C1 which connects C1 to Vin) to ground if the switch is on. The sw_cap_gnd switch is turned on if C1 bypass capacitance is desired. One of the sw_act switches connects the gate of M5 to the source of M3 if the switch is on. The other one of the sw_act switches connects the output of the current source to the drain of M5 if the switch is on. The sw_act switches are turned on if the active cascode (having the current source and the device M5) is desired. One of the sw_noact switches connects the gate of M5 to ground if the switch is on. The other one of the sw_noact switches connects the gate of M3 to a bias voltage Vb3 if the switch is on. The sw_noact switches are turned on if the active cascode is not desired. The signal for controlling sw_act can be inverted (using an inverter) to control sw_noact switches.

The following table illustrates the states of the switches (as controlled by control signals) and the corresponding configurations of the reconfigurable buffer. As seen in the table, the reconfigurable buffer offer a myriad of possible configurations which can provide tremendous flexibility for the user to select which configuration to use. The use switches and the control thereof to provide a reconfigurable voltage buffer can be applied to any voltage buffer designs disclosed herein, even when the bootstrap device design is varied, and/or the active cascode design is varied.

| Sw_cap_ff | sw_cap_gnd | sw_act | sw_noact | Configuration |
|---|---|---|---|---|
| ON | OFF | ON | OFF | C1 feedforward distortion cancellation + active cascode; see configuration in FIG. 2 (preferred for low input frequencies) |
| ON | OFF | OFF | ON | C1 feedforward distortion cancellation and no active cascode, see configuration in FIG. 1 (has OK performance across the board) |
| OFF | ON | ON | OFF | Bypass C1 + active cascode (can protect from kickback, preferred for low input frequencies with the use of the active cascode) |
| OFF | ON | OFF | ON | Bypass C1, no active cascode, see configuration in FIG. 3 (can be effective for high input frequency, can protect from kickback) |
| OFF | OFF | ON | OFF | No C1, active cascode (can provide high input bandwidth and high input impedance, can be effective for low input frequency) |

| Sw_cap_ff | sw_cap_gnd | sw_act | sw_noact | Configuration |
|---|---|---|---|---|
| OFF | OFF | OFF | ON | No C1, no active cascode, see configuration in FIG. 4 (can provide high input bandwidth and high input impedance, can be effective for high input frequency) |

Figure 6:
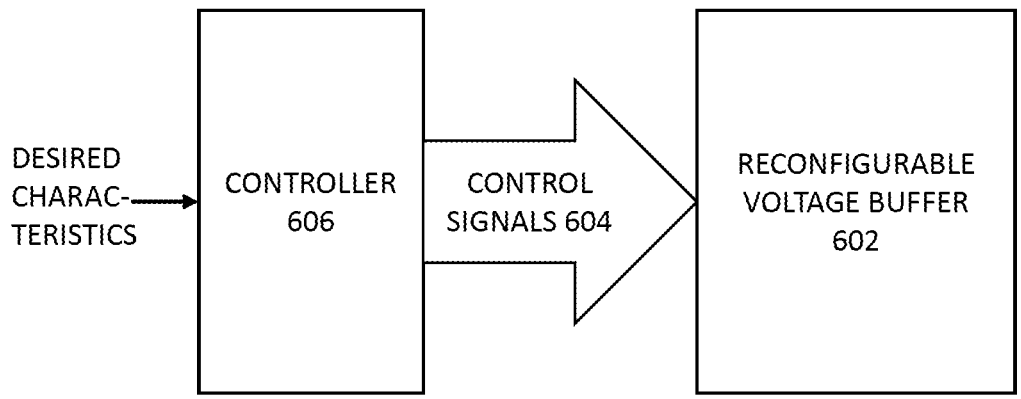
FIG. 6 is a block diagram showing an illustrative system for controlling the configurable voltage buffer shown in FIG. 5, according to some embodiments of the disclosure.

FIG. 6 is a block diagram showing an illustrative system for controlling the configurable voltage buffer shown in FIG. 5, according to some embodiments of the disclosure. To accommodate the different needs of different users, a reconfigurable voltage buffer 602 (having structure of FIG. 5) can be configured by the controller 606 using the switches into any of the structures shown in FIGS. 1-4. Based on the desired characteristics, e.g., input frequency, bandwidth, etc., the controller 606 can generate control signals 604 to flip the switches shown in FIG. 5 on or off). Note that trying to achieve the best performance across all conditions using only one of those structures can be challenging and would result in higher power consumption.

Figure 7:
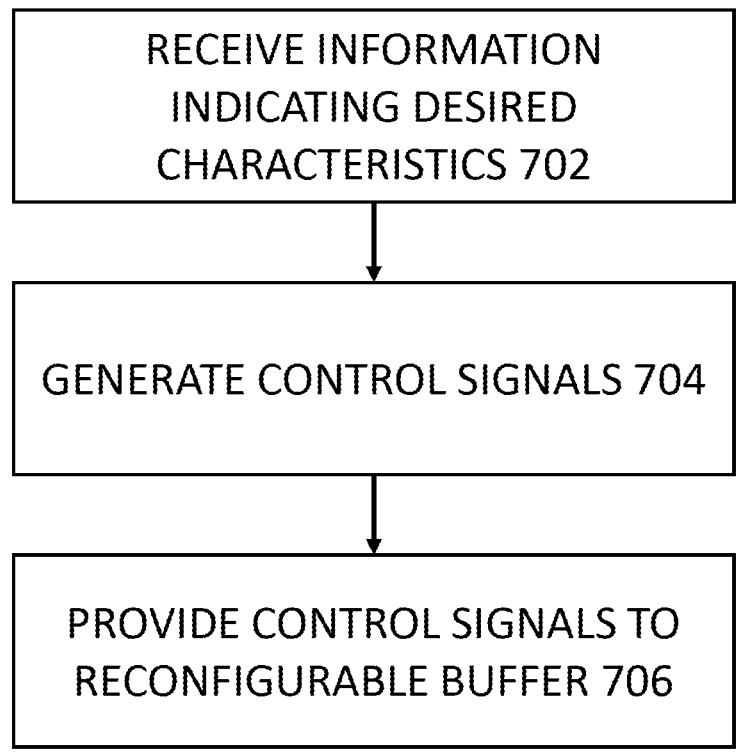
FIG. 7 shows a flow diagram illustrating an exemplary method for controlling the configurable voltage buffer shown in FIG. 5, according to some embodiments of the disclosure.

The controller can implement a method for configuring the reconfigurable buffer 602 based on the desired characteristics of the voltage buffer. FIG. 7 shows a flow diagram illustrating an exemplary method for controlling the configurable voltage buffer shown in FIG. 5, according to some embodiments of the disclosure. The method can include receiving user input or information indicating one or more desired characteristics for the reconfigurable buffer (box 702). In some cases, the method can include receiving a signal indicating the one or more desired characteristics. The desired characteristics can specify quantitative information or qualitative information relating to input bandwidth, input frequency, input impedance, sample rate, etc. Based on the user input or information, the controller can generate control signals to select a configuration for the reconfigurable buffer (box 704). For instance, the desired characteristics can be mapped to a set of signals for controlling the switches in the reconfigurable buffer. The mapping can be performed using one or more functions or one or more lookup tables. The control signals are then provided to the switches of the reconfigurable buffer to control the open and closed states of those switches (box 706). The states of the switches can change the reconfigurable voltage buffer to a particular desired configuration to meet the one or more desired characteristics.

In some cases, a user can select the desired topology by specifying the control signals corresponding to the desired topology. In other cases, the user can provide one or more desired characteristics to the controller which in turns determines the appropriate control signals which corresponds to a desired topology matching the desired characteristics.

The approach for providing a reconfigurable voltage buffer as illustrated in FIGS. 6 and 7 can be applied to any voltage buffer designs disclosed herein, even when the bootstrap device design is varied, and/or the active cascode design is varied.

Exemplary Performance Results

Figure 8:
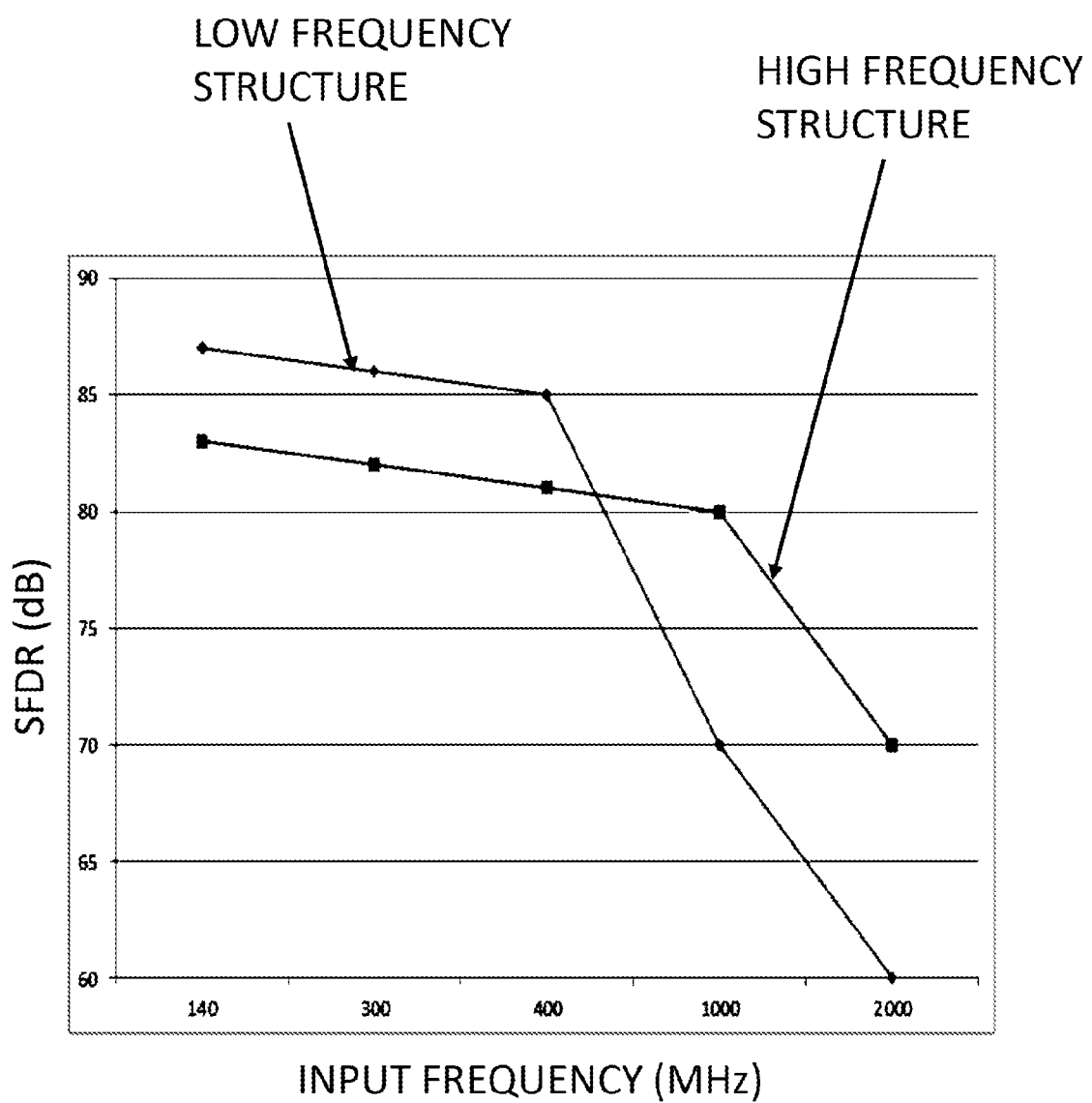
FIG. 8 shows exemplary performance using the low-frequency configuration and the high-frequency configuration, according to some embodiments of the disclosure.

FIG. 8 shows exemplary performance using the low-frequency configuration and the high-frequency configuration, according to some embodiments of the disclosure. The performance is measured by Spurious-Free Dynamic Range (SFDR). The low-frequency plot shows the performance achieved by the structure seen in FIG. 2. The high-frequency plot shows the performance achieved by the structure seen in FIG. 3. The crossover point is around 500 MHz. For frequencies lower than 500 MHz, the user can select the low-frequency configuration which achieves better performance (i.e., higher SFDR) than the high-frequency configuration. For frequencies higher than 500 MHz, the user can select the high-frequency configuration which achieves better performance (i.e., higher SFDR) than the low-frequency configuration.

Variations of the Bootstrap Device

Figure 9:
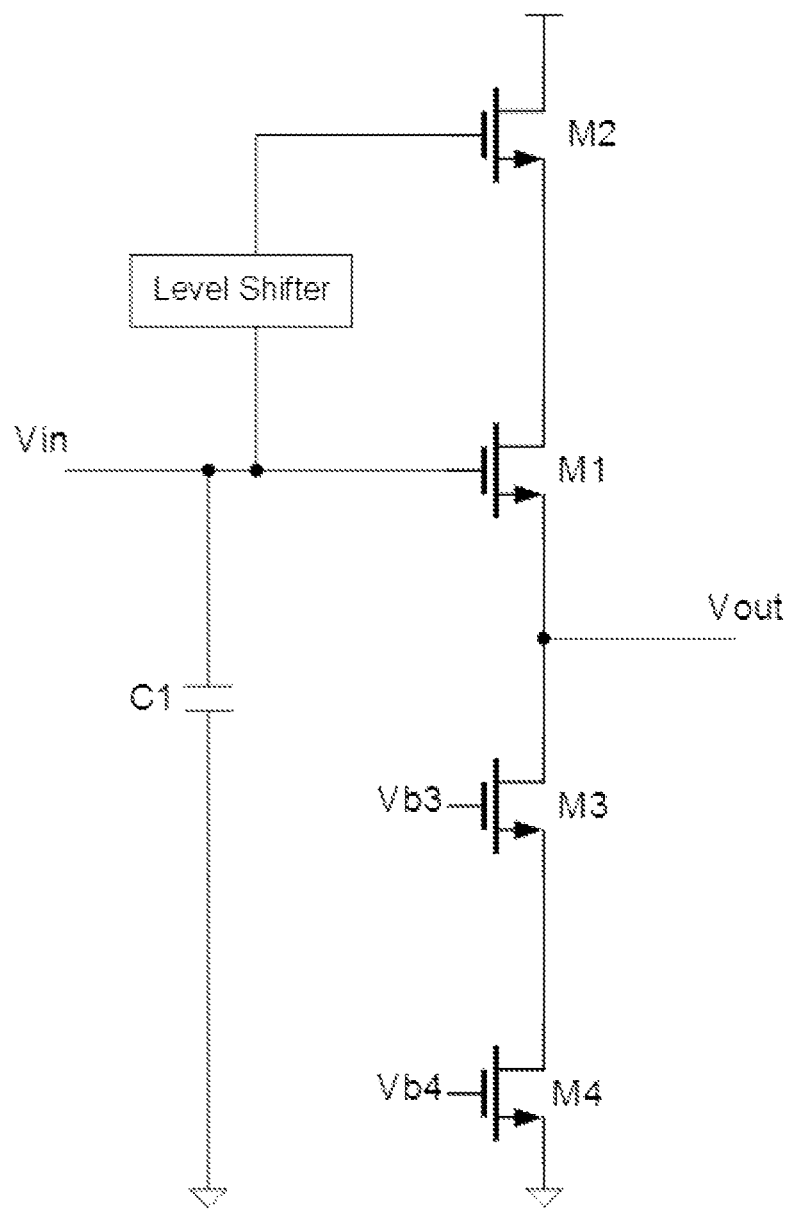
FIG. 9 shows an exemplary implementation for a bootstrap device, according to some embodiments of the disclosure.
Figure 10:
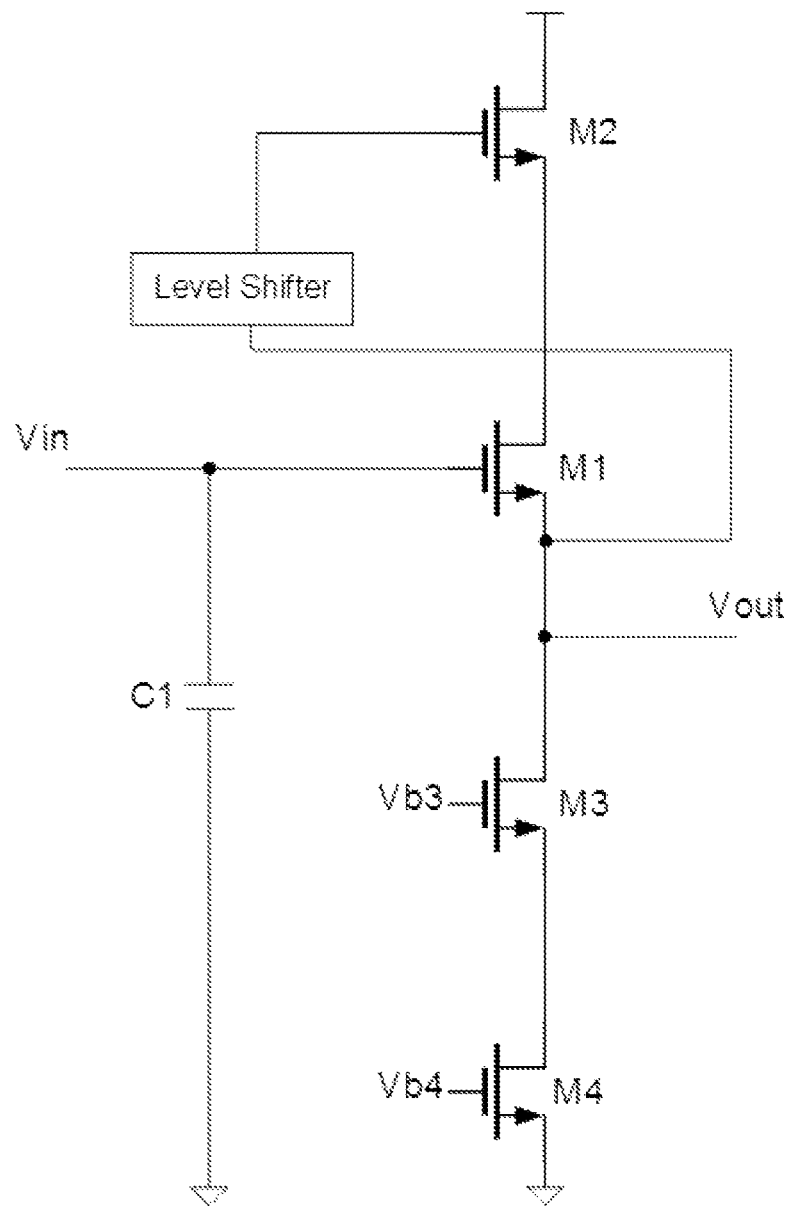
FIG. 10 shows another exemplary implementation for a bootstrap device, according to some embodiments of the disclosure.
Figure 11:
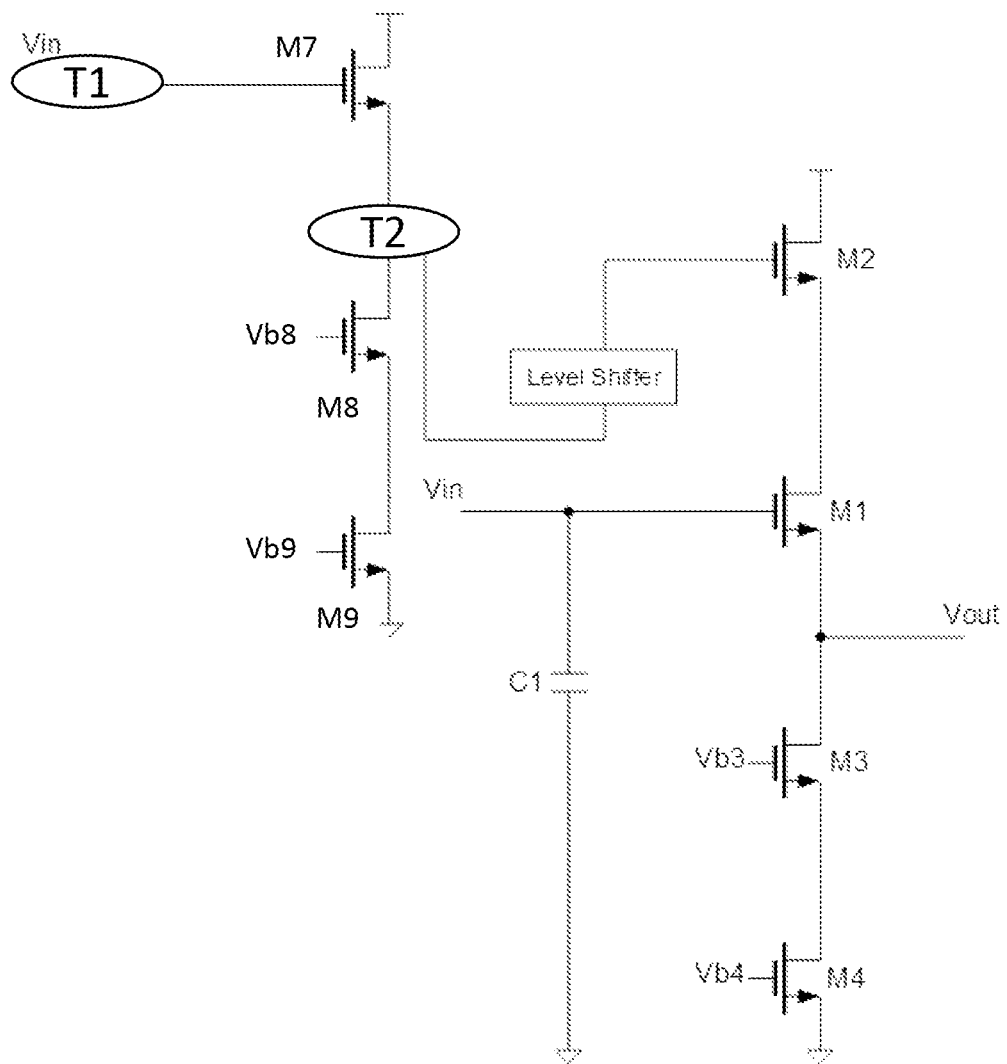
FIG. 11 shows yet another exemplary implementation for a bootstrap device, according to some embodiments of the disclosure.

FIG. 1 shows one possible implementation of the bootstrap device. In the implementation, the bootstrap device controls the drain to source voltage of M1 by connecting the source of M2 to the drain of M1, and by connecting the gate of M2 to the voltage input node via C2. FIGS. 9-11 describes other possible implementations for the bootstrap device usable in a voltage buffer design, and/or in a reconfigurable voltage buffer design.

It is noted that C2 in FIG. 1 is optional, or the level shifting function of C2 can be provided by other means. FIG. 9 shows an exemplary implementation for a bootstrap device, according to some embodiments of the disclosure. In this implementation, the gate of M2 is connected to the voltage input node via a level shifting device. It is noted that in some cases, the level shifting device can be left out altogether. The need for the level shifting device depends on the required operating/biasing point of M2. Leaving out the level shifting device can remove its loading effect on the input. In some embodiments, C1 can be omitted, if desired, or C1 can be provided to connect the voltage input node Vin to the source of M3 as feedforward capacitor, if desired.

FIG. 10 shows another exemplary implementation for a bootstrap device, according to some embodiments of the disclosure. In this variation, instead of connecting the gate of M2 to the voltage input node, the gate of M2 is connected (via a level shifter or without the level shifter) to the source of M1 (which is also the voltage output node, or in other words, the output of the source-follower device). This topology has the advantage of being able reduce the load on the input. It is appreciated that this configuration also benefits from the bootstrapping effect of being able to reduce/control the drain to source voltage of M1. In particular, the source of M2 tends to follow the gate of M2. The source of M1 also tends to follow the gate of M1, which is Vin. By connecting the gate of M2 to the source of M1, the source of M2 would be forced to track the source of M1 and thus Vin as well. This achieves the effect of keeping the drain-to-source voltage of M1 substantially constant, i.e., bootstrapping M1 to control the variation of the drain-to-source voltage Vds of M1. Vds becomes substantially fixed and the linearity of M1 is improved. In some embodiments, C1 can be omitted, if desired, or C1 can be provided to connect the voltage input node Vin to the source of M3 as feedforward distortion cancellation capacitor, if desired.

FIG. 11 shows yet another exemplary implementation for a bootstrap device, according to some embodiments of the disclosure. In this variation, instead of connecting the gate of M2 directly to the voltage input node, the gate of M2 can be indirectly connected to the voltage input node via a further source-follower device. The effect of using a further source-follower device allows the bootstrap device to connect to the voltage input node indirectly (i.e., via the further source follower). This topology has the advantage of being able reduce the load on the input.

In the example shown in FIG. 11, the further source follower device has a first terminal (T1) connected to the voltage input node Vin a second terminal (T2) having a voltage following the voltage at the voltage input node Vin. The exemplary further source follower in this case includes at least transistor M7, a source-follower device, whose gate is connected to Vin and the source following the gate is connected to the second terminal. The exemplary further source follower may further include transistors M8 and M9, biased by bias voltages Vb8 and Vb9 respectively, as a cascode current source for providing the current going through M7. The connection of the gate of M2 to the second terminal of the further source follower device can be done via a level shifter or without the level shifter. In some embodiments, C1 can be omitted, if desired, or C1 can be provided to connect the voltage input node Vin to the source of M3 as feedforward distortion cancellation capacitor, if desired.

Variations of the Active Cascode Device

FIGS. 2 and 5 both show only one possible implementation for the active cascode device. It is envisioned that other implementations are possible. These variations on the active cascode device are illustrated in FIGS. 12 and 13, which depicts other configurations usable in a voltage buffer design and/or a reconfigurable voltage buffer design.

FIG. 12 shows an exemplary implementation for an active cascode device, according to some embodiments of the disclosure. In this variation, instead of connecting the source of the transistor device M5 to ground, a level shifter can be provided to adjust the DC voltage correctly for M5. The same approach for reconfiguring the voltage buffer (described herein) is applicable to the embodiment shown in FIG. 12.

FIG. 13 shows another exemplary implementation for an active cascode device, according to some embodiments of the disclosure. In this variation, the active cascode device is a differential active cascode device. The first current source I1 and the fifth transistor device M5 form a first of two branches of the differential active cascode device (current source I1 feeds the drain of M5). The active cascode device further comprises a second current source I2, a sixth transistor device M6, and a third current source I3. The second current source I2 and the sixth transistor device M6 form a second of two branches of the differential active cascode device (I2 feeds the drain of M6). The third current source I3 pulls current from both branches of the differential active cascode. The source of the fifth transistor device M5 is connected to the third current source I3 and to the source of the sixth transistor device M6. The implementation involving the differential active cascode device has better ground noise rejection and better sensitivity to the process variability, because the operating bias voltage of the source of M3 is determined by the "Vbias" voltage, which can be fixed, instead of depending on the Vgs (gate to source voltage) of the M5 device, which can vary with process.

The approach for reconfiguring the voltage buffer (described herein) is also applicable to the embodiment shown in FIG. 12. A further switch (sw_act) can be provided to disconnect the second current source when the active cascode device is to be used (the switch is off) and to connect the second current source to the drain of M6 when the active cascode device is to be used (the switch is on).

Other Notes, Examples, and Implementations

In all of structures described herein, there can be some modification to improve performance. For example, more than one cascode levels can be implemented by adding another device in series with M2 (with the appropriate level shifting) or in series with M3.

While the disclosure/claims describe the implementations using NMOS transistors devices, it is envisioned that complementary configurations using PMOS transistor(s) (p-type metal-oxide semiconductor transistor(s)) or equivalent bipolar-junction transistors (BJTs) can also be replace one or more of the NMOS transistor (or transistor devices) to provide the disclosed voltage buffers. It is understood by one skilled in the art that a transistor device can be generalized as a device having three (main) terminals. Furthermore, it is understood by one skilled in the art that a transistor device, during operation, can have a characteristic behavior of transistors corresponding to devices such as NMOS, PMOS, NPN BJT, PNP BJT devices (and any other equivalent transistor devices).

For instance, the present disclosure/claims encompasses implementations where all NMOS devices are replaced by PMOS devices. The circuits using PMOS devices would be configured in an "upside-down" manner compared to the ones disclosed herein using NMOS devices (Vdd and ground are swapped). In one example, M2 of FIG. 1 would be between M1 and ground, while M3 and M4 would be between M1 and Vdd. Varied implementations are equivalent to the disclosed implementations using NMOS transistors devices because the varied implementations would perform substantially the same function in substantially the same way to yield substantially the same result.

Complementary or equivalent configurations (using BJTs in place of NMOS transistors) would be considered interchangeable with embodiments described herein using NMOS transistors to a person with ordinary skill in the art. For instance, when the disclosure/claims mention a "drain" of a metal-oxide field effect transistor (MOSFET) device, the disclosure/claims also envisions an equivalent implementation where the "drain" corresponds to the "collector" of a BJT. The same goes for "source" of a MOSFET corresponding to the "emitter" of a BJT, and for the "gate" of a MOSFET corresponding to the "base" of a BJT. A "source follower" device can correspond to an "emitter follower" device, and so on.

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate Ics located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of any appended claims and/or summary of features. The specifications apply only to one non-limiting example and, accordingly, they should be construed as such. In the foregoing description, example embodiments have been described with reference to particular processor and/or component arrangements. Various modifications and changes may be made to such embodiments without departing from the scope of any appended claims and/or summary of features. The description and drawings are, accordingly, to be regarded in an illustrative rather than in a restrictive sense.

Note that the activities discussed above with reference to the FIGURES are applicable to any integrated circuits that involve high speed data converters, signal processing, particularly those that can execute specialized software programs, or algorithms, some of which may be associated with processing digitized real-time data. Certain embodiments can relate to multi-DSP signal processing, floating point processing, signal/control processing, fixed-function processing, microcontroller applications, etc.

In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions/methods relating to the controller of FIG. 6 or the method shown in FIG. 7, illustrate only some of the possible functions that may be executed by, or within, the system illustrated in FIG. 6. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of any appended claims and/or summary of features. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in any of the appended claims and/or summary of features claims; and (b) does not intend, by any statement in the specification, to limit this disclosure in any way that is not otherwise reflected in any appended claims and/or summary of features.

Note that all optional features of the apparatus described above may also be implemented with respect to the method or process described herein and specifics in the examples may be used anywhere in one or more embodiments.

In a first example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The system can include means for clocking data from the digital core onto a first data output of a macro using a first clock, the first clock being a macro clock; means for clocking the data from the first data output of the macro into the physical interface using a second clock, the second clock being a physical interface clock; means for clocking a first reset signal from the digital core onto a reset output of the macro using the macro clock, the first reset signal output used as a second reset signal; means for sampling the second reset signal using a third clock, which provides a clock rate greater than the rate of the second clock, to generate a sampled reset signal; and means for resetting the second clock to a predetermined state in the physical interface in response to a transition of the sampled reset signal.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

Summary of Features

Example 1 includes a voltage buffer having a voltage input and a voltage output, the voltage buffer comprising: a source follower device (M1) having a first terminal (gate) connected to the voltage input and a second terminal (source) for providing the voltage output; a cascode current source device (M3 and M4) connected to the second terminal (source) of the source follower device, said cascode current source device comprising a first transistor device (M3) and a second transistor device (M4) in series; and a bootstrap device (M2) connected between the voltage input and a third terminal (drain) the source follower device; wherein the bootstrap device is configured to reduce and control the variation of the voltage across the third terminal (drain) and the second terminal (source) of the source follower device. Further embodiments of this Example is explained in relation to at least FIG. 1.

Example 2 includes a voltage buffer having a voltage input and a voltage output. The voltage buffer comprising: a source follower device (M1) having a first terminal (gate) connected to the voltage input and a second terminal (source) for providing the voltage output; a cascode current source device (M3 and M4) connected a second terminal (gate) of the source follower device, said cascode current source device comprising a first transistor device (M3) and a second transistor device (M4) in series; wherein the first transistor device forms an active cascode with a third transistor device (M5). Further embodiments of this Example is explained in relation to at least FIG. 2.

Example 3 can combine Example 1 and Example 2. This embodiment combines both the bootstrap device and the active cascode, which is explained in relation to at least FIG. 2.

In Example 4, Example 1, 2, or 3, can optionally include capacitance (C1) connected between the voltage input and a terminal of the first transistor device (source of M3) in the cascode source device to provide feedforward distortion cancellation.

In Example 5, Example 1, 2, or 3, can optionally include capacitance (C1) connected between the voltage input and ground. Further embodiments of this Example is explained in relation to at least FIG. 3. One embodiment may exclude the capacitance all together.

In Example 6, any one of the above examples can include one or more switches to provide a reconfigurable voltage buffer. Further embodiments of this example is explained in relation to at least FIGS. 5 and 6.

Example 7 is a reconfigurable voltage buffer system, said system including a controller for receiving input specifying one or more desired characteristics for the voltage buffer and generating control signals based on the one or more desired characteristics; and a reconfigurable voltage buffer such as the one in Example 6. The characteristics can include input frequency and/or bandwidth. The control signals may be used to control one or more switches of the reconfigurable voltage buffer.

Example 8 is a method for configuring a voltage buffer system, the method comprising: receiving input specifying one or more desired characteristics for the voltage buffer such as the Example 6; and generating control signals based on the one or more desired characteristics. The method further includes providing the control signals to control one or more switches of the voltage buffer.

What is claimed is:

1. A voltage buffer having a voltage input node and a voltage output node, the voltage buffer comprising:
   a source follower device comprising a first transistor device having a first terminal connected to the voltage input node and a second terminal connected to the voltage output node;
   a current source device connected to the second terminal of the source follower device for delivering bias current for the source follower device; and
   a bootstrap device configured to control the variation of the voltage across a third terminal and the second terminal of the source follower device, wherein the bootstrap device comprises a second transistor device having a source connected to a drain of the first transistor device and a gate connected to the voltage input node via a first level shifter or to the voltage output node via a second level shifter.

2. The voltage buffer of claim 1, wherein:
the first terminal of the first transistor is a gate of the first transistor, the gate of the first transistor being directly connected to the voltage input node; and
the second terminal of the first transistor is a source of the first transistor device, the source of the first transistor device following a voltage at the voltage input node.

3. The voltage buffer of claim 1, wherein:
said current source device comprises a second transistor device and a third transistor device; and
the source of the second transistor device is connected to a drain of the third transistor device.

4. A voltage buffer having a voltage input node and a voltage output node, the voltage buffer comprising:
a source follower device comprising a first transistor device having a first terminal connected to the voltage input node and a second terminal connected to the voltage output node;
a further source follower device comprising having a first terminal connected to the voltage input node and a second terminal having a voltage following the voltage at the voltage input node;
a current source device connected to the second terminal of the source follower device for delivering bias current for the source follower device; and
a bootstrap device configured to control the variation of the voltage across a third terminal and the second terminal of the source follower device, wherein the bootstrap device comprises a second transistor device having a source connected to a drain of the first transistor device, and a gate connected to the second terminal of the further source follower device.

5. The voltage buffer of claim 4, wherein the gate of the second transistor device is connected to the second terminal of the further source follower device via a level shifter.

6. A voltage buffer having a voltage input node and a voltage output node, the voltage buffer comprising:
a source follower device having a first terminal connected to the voltage input node and a second terminal connected to the voltage output node;
a current source device connected to the second terminal of the source follower device for delivering bias current for the source follower device, said current source device comprising a first transistor device and a second transistor device, and a source of the first transistor device is connected to a drain of the second transistor device;
a first current source; and
a third transistor device;
wherein the first transistor device of forms an active cascode device with the first current source and the third transistor device.

7. The voltage buffer of claim 6, wherein:
a source of the third transistor device is connected to ground via level shifter.

8. The voltage buffer of claim 6, wherein:
the active cascode device is a differential active cascode device;
the first current source and the third transistor device form a first of two branches of the differential active cascode device;

the active cascode device further comprises a second current source, a fourth transistor device, and a third current source;
the second current source and the fourth transistor device form a second of two branches of the differential active cascode device; and
a source of the third transistor device is connected to the third current source and to a source of the fourth transistor device.

9. The voltage buffer of claim 6, wherein:
the voltage buffer further comprises a first capacitor connected between the voltage input node and the source of the second transistor device.

10. A voltage buffer having a voltage input node and a voltage output node, the voltage buffer comprising:
a source follower device having a first terminal connected to the voltage input node and a second terminal connected to the voltage output node;
a current source device connected to the second terminal of the source follower device for delivering bias current for the source follower device;
a bootstrap device configured to control the variation of the voltage across the third terminal and the second terminal of the source follower device; and
a first capacitor connected between the voltage input node and ground.

11. A reconfigurable voltage buffer having a voltage input node and a voltage output node, the reconfigurable voltage buffer comprising:
a source follower device having a first terminal connected to the voltage input node and a second terminal connected to the voltage output node;
a current source device for delivering bias current for the source follower device, comprising a first transistor device and a second transistor device in a cascode configuration, wherein a source of the first transistor device is connected to a drain of the second transistor device, and a drain of the first transistor device is connected to the second terminal of the source follower device;
a first capacitor having a first terminal connected to the voltage input node; and
one or more switches for reconfiguring one or more connections of the first capacitor comprising a first switch and a second switch, wherein, when the first switch is on, the first switch connects a second terminal of the first capacitor to ground, and when the second switch is on, the second switch connects a second terminal of the first capacitor to a source of a first transistor device and a drain of the second transistor device.

12. The reconfigurable voltage buffer of claim 11, further comprising:
a third transistor having a drain connected to a gate of the first transistor device;
a current source; and
a third switch and a fourth switch, wherein when the third switch is on, the third switch connects the gate of the third transistor device to the source of the first transistor device and the drain of the second transistor device, and when the fourth switch is on, the fourth switch connects the drain of the third transistor device to the current source.

13. The reconfigurable voltage buffer of claim 12, further comprising:
the one or more switches further comprises a fifth switch and a sixth switch;

the fifth switch, when the fifth switch is on, connects the gate of the third transistor device to ground; and the sixth switch, when the sixth switch is on, connects a bias voltage to the gate of the first transistor device.

14. A reconfigurable voltage buffer having a voltage input node and a voltage output node, the reconfigurable voltage buffer comprising:
   a source follower device having a first terminal connected to the voltage input node and a second terminal connected to the voltage output node;
   a current source device for delivering bias current for the source follower device, comprising a first transistor device and a second transistor device, wherein a source of the first transistor device is connected to a drain of the second transistor device;
   a third transistor having a drain connected to a gate of the first transistor device;
   a current source; and
   a first switch and a second switch, wherein when the first switch is on, the first switch connects the gate of the third transistor device to the source of the first transistor device and the drain of the second transistor device, and when the second switch is on, the second switch connects the drain of the third transistor device to the current source.

15. The reconfigurable voltage buffer of claim 11, wherein:
   the one or more switches further comprises a third switch and a fourth switch;
   the third switch, when the third switch is on, connects the gate of the third transistor device to ground; and
   the fourth switch, when the fourth switch is on, connects a bias voltage to the gate of the first transistor device.

16. The voltage buffer of claim 4, further comprising:
   a further current source device connected to the second terminal of the further source follower device.

17. The voltage buffer of claim 16, wherein the further current source device comprises a third transistor device and a fourth transistor device in a cascode configuration.

18. The voltage buffer of claim 6, wherein:
   a drain of the third transistor device is connected to a gate of the first transistor device; and
   a gate of the third transistor device is connected to the source of the first transistor device.

19. The voltage buffer of claim 6, wherein:
   a source of the third transistor device is connected to ground.

20. A method for reconfiguring a voltage buffer having a voltage input node and a voltage output node, the method comprising:
   receiving a signal indicating one or more desired characteristics of the voltage buffer;
   generating control signals to control switches in the voltage buffer based on the signal; and
   configuring, using the control signals, the switches in the voltage buffer to include one or more of the following: a bypass capacitance at the voltage input node, feed-forward distortion cancellation, and active cascode.

21. The method of claim 20, wherein the one or more desired characteristics comprises one or more of the following: input frequency, input bandwidth, input impedance, and sample rate.

* * * * *